United States Patent
Bryant et al.

(10) Patent No.: US 7,183,573 B2
(45) Date of Patent: Feb. 27, 2007

(54) DISPOSABLE SPACER FOR SYMMETRIC AND ASYMMETRIC SCHOTTKY CONTACT TO SOI MOSFET

(75) Inventors: Andres Bryant, Essex Junction, VT (US); Jerome B. Lasky, Essex Junction, VT (US); Effendi Leobandung, Wappingers Falls, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/978,528

(22) Filed: Oct. 17, 2001

(65) Prior Publication Data

US 2002/0048841 A1 Apr. 25, 2002

Related U.S. Application Data

(62) Division of application No. 09/425,394, filed on Oct. 22, 1999, now Pat. No. 6,339,005.

(51) Int. Cl.
*H01L 21/00* (2006.01)
*H01L 21/238* (2006.01)

(52) U.S. Cl. .......... 257/66; 257/281; 257/282; 257/347; 438/98; 438/167

(58) Field of Classification Search .......... 257/66, 257/347, 344, 381, 384
See application file for complete search history.

(56) References Cited

U.S. PATENT DOCUMENTS

| 4,728,617 | A |   | 3/1988 | Woo et al. |
| 4,855,246 | A | * | 8/1989 | Codella et al. ............. 438/185 |
| 4,855,247 | A |   | 8/1989 | Ma et al. |
| 4,965,213 | A |   | 10/1990 | Blake |

(Continued)

FOREIGN PATENT DOCUMENTS

DE 42 11 999 * 10/1992

(Continued)

OTHER PUBLICATIONS

Sleight et al. "DC and Transient Characterization of a compact Schottky Body Contact Technology for SOI Transistors" IEEE Transactions on Electron Devices, vol. 46, No. 7, Jul. 1999.*

*Primary Examiner*—Leonardo Andujar
*Assistant Examiner*—Ahmed N. Sefer
(74) *Attorney, Agent, or Firm*—Connolly Bove Lodge & Hutz, LLP; Larry Hume; William Sabo, Esq.

(57) ABSTRACT

A silicon on insulator transistor is disclosed which has a Schottky contact to the body. The Schottky contact may be formed on the source and/or drain side of the gate conductor. A spacer, with at least a part thereof being disposable, is formed on the sidewalls of the gate conductor. Extension regions are provided in the substrate which extend under the spacer and the gate conductor. Source and drain diffusion regions are implanted into the substrate adjacent to the extension regions. The disposable part of the spacer is then removed to expose a portion of the extension region. A metal layer is formed at least in the extension regions, resulting in the Schottky contact.

10 Claims, 2 Drawing Sheets

U.S. PATENT DOCUMENTS

| | | | |
|---|---|---|---|
| 5,073,506 A | 12/1991 | Maszara et al. | |
| 5,341,028 A * | 8/1994 | Yamaguchi et al. | 257/344 |
| 5,468,665 A | 11/1995 | Lee et al. | |
| 5,491,099 A | 2/1996 | Hsu | |
| 5,583,059 A * | 12/1996 | Burghartz | 437/31 |
| 5,591,650 A | 1/1997 | Hsu et al. | |
| 5,729,039 A | 3/1998 | Beyer et al. | |
| 5,753,955 A | 5/1998 | Fechner | |
| 5,804,856 A | 9/1998 | Ju | |
| 5,804,858 A | 9/1998 | Hsu et al. | |
| 5,869,879 A | 2/1999 | Fulford, Jr. et al. | |
| 5,899,722 A * | 5/1999 | Hunag | 438/305 |
| 5,905,293 A * | 5/1999 | Jeng et al. | 257/408 |
| 5,908,313 A | 6/1999 | Chan et al. | |
| 5,946,581 A | 8/1999 | Gardner et al. | |
| 5,965,919 A | 10/1999 | Yoo | |
| 6,049,110 A * | 4/2000 | Koh | 257/347 |
| 6,060,749 A | 5/2000 | Wu | |
| 6,063,681 A | 5/2000 | Son | |
| 6,091,076 A * | 7/2000 | Deleonibus | 257/24 |
| 6,096,615 A * | 8/2000 | Gardner et al. | 438/305 |
| 6,100,159 A * | 8/2000 | Krivokapic | 438/413 |
| 6,121,100 A | 9/2000 | Andideh et al. | |
| 6,150,243 A | 11/2000 | Wieczorek et al. | |
| 6,174,776 B1 | 1/2001 | Hao et al. | |
| 6,180,988 B1 | 1/2001 | Wu | |
| 6,184,097 B1 | 2/2001 | Yu | |
| 6,187,676 B1 | 2/2001 | Kim et al. | |
| 6,200,864 B1 | 3/2001 | Selcuk | |
| 6,211,001 B1 * | 4/2001 | Hsu | 438/220 |
| 6,211,027 B1 * | 4/2001 | Lin et al. | 438/303 |
| 6,255,703 B1 * | 7/2001 | Hause et al. | 257/384 |
| 6,271,133 B1 | 8/2001 | Lim et al. | |
| 6,284,613 B1 * | 9/2001 | Subrahmanyam et al. | 438/307 |
| 6,297,529 B1 * | 10/2001 | Imai | 257/318 |

FOREIGN PATENT DOCUMENTS

| | | | |
|---|---|---|---|
| EP | 480635 | * | 4/1992 |
| GB | 2 336 717 | * | 10/1999 |
| JP | 2-228041 | | 9/1990 |
| JP | 3-024735 | | 2/1991 |
| JP | 10-12887 | * | 1/1998 |
| TW | 289843 | * | 11/1996 |

* cited by examiner

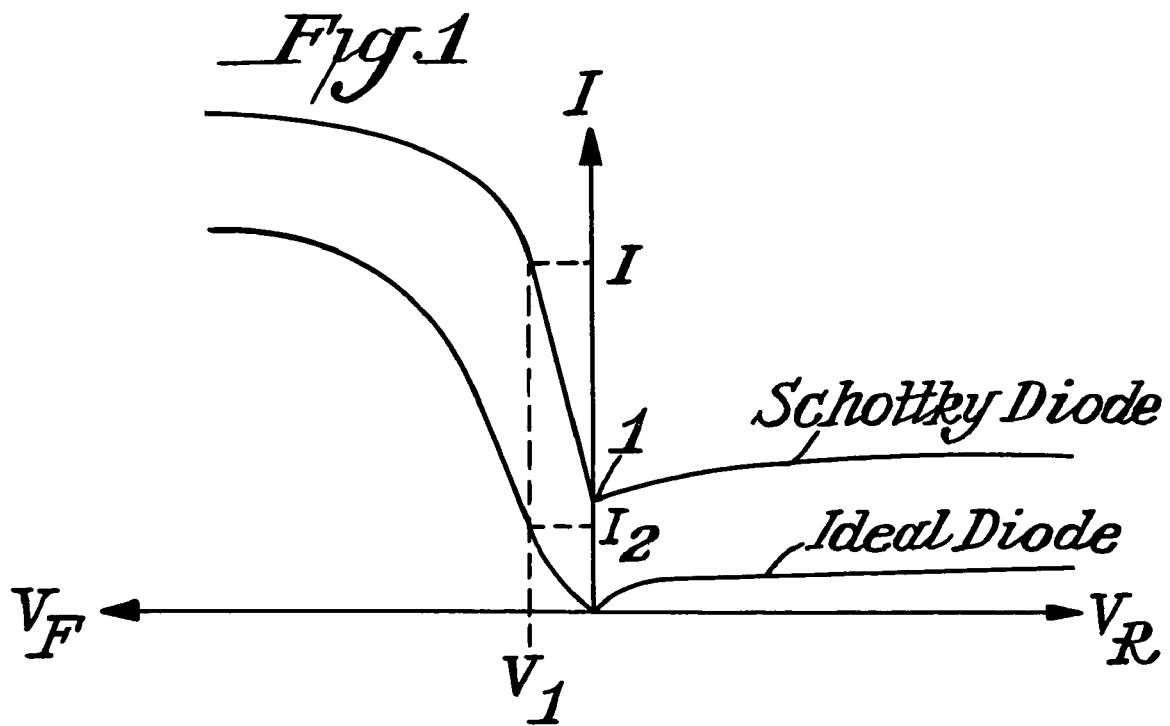
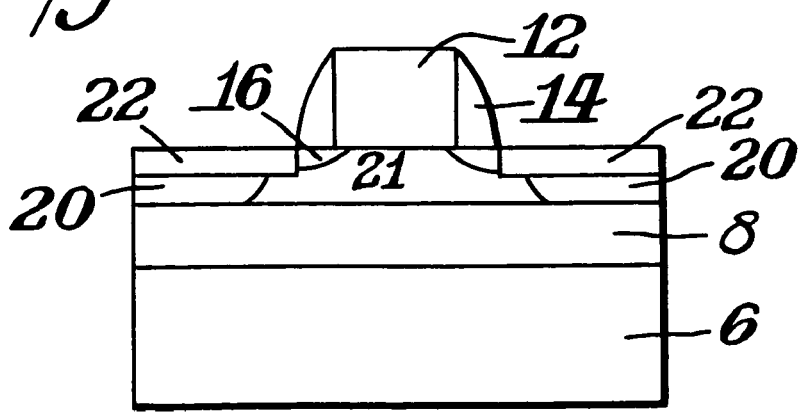

DISPOSABLE SPACER FOR SYMMETRIC AND ASYMMETRIC SCHOTTKY CONTACT TO SOI MOSFET

The present application is a divisional application of application Ser. No. 09/425,394, filed Oct. 22, 1999 now U.S. Pat. No. 6,339,005.

FIELD OF THE INVENTION

The present invention generally relates to a structure for minimizing floating body effects in silicon on insulator (SOI) technology utilizing a Schottky diode and a method of forming the same.

BACKGROUND OF THE INVENTION

SOI technology is becoming an increasingly important field in the manufacture of integrated circuits. SOI technology deals with forming transistors in a layer of semiconductor material which overlies an insulating layer. The insulating layer is formed on an underlying substrate. The transistor comprises source and drain regions implanted into the semiconductor material. A gate structure is formed on the semiconductor material between the source and drain regions. The source and drain regions are typically formed deep into the semiconductor material and reach the insulating layer. A part of the semiconductor material isolated between the source and drain regions and underlying the gate structure is referred to as the body of the transistor.

Due to the difficulty of forming a body contact, the body of the transistor in SOI is typically left electrically floating. A floating body can sometimes adversely affect the characteristics of the transistor. For example, when a high voltage is applied on the drain of the transistor, there is a charge accumulation in the body. Normally, in bulk transistors, the charge accumulation is carried away by having the wafer grounded. However, in SOI, the body is isolated by the insulating layer so a charge accumulates in the body area. As a result, a lateral bipolar transistor is formed with the source acting as the emitter and the body acting as the base. When a positive voltage is applied to the drain, a positive charge accumulates in the body. A diode formed by the junction of the source and body will turn on at a certain voltage. At this voltage, the current conducted through the transistor begins to increase exponentially. Thus, as the voltage on the drain is gradually increased, at a certain voltage, for example about 2.5 volts, the current through the transistor will begin to increase exponentially.

Although there is some conduction of current through the diode formed by the body and the source, the conduction is not enough to remove all the charge accumulating in the body. In essence, there is a race between the amount of current drawn off from the body by the source and the amount of charge accumulated in the body as a result of the high voltage applied to the drain.

This characteristic of SOI technology may cause difficulty during burn-in of a chip. Burn-in of a chip refers to the practice of operating the chip at an elevated voltage in order to test it. For example, if a chip is designed to operate at 1.8 volts, a voltage approximately 1.5 times the operating voltage, that is approximately 2.7 volts, is applied to the chip during burn-in. This is done so if any incipient defects exist in the transistor, the transistor will fail during burn-in and not during operation in the field. However, due to the above described tendency of the body to accumulate charge, the transistor may not be able to accommodate the higher burn-in voltage. Thus, there is a need to accelerate the amount of charge removed from the body to the source in order to keep the charge of the body low. This will then allow the diode to operate normally during burn-in.

SUMMARY OF THE INVENTION

A field effect transistor (FET) on an SOI substrate and method of forming the same is provided. An SOI substrate having a silicon base substrate, an insulating layer on the base substrate, and a semiconductor material on the insulating layer is provided. A conductive gate is formed on the semiconductor material. First spacers are formed on sidewalls of the gate and on the semiconductor material. Diffusion extensions are formed in the semiconductor material adjacent to and extending under a part of the gate. Second spacers are then formed on the first spacers and on the semiconductor material. Deep diffusions are implanted into the semiconductor material. The deep diffusions are implanted adjacent to the second spacers, close to the insulating layer and abutting the diffusion extensions. The semiconductor material between the deep diffusions defines a body region of the FET. At least a part of one of the second spacers is removed from the first spacers on the sidewall of the gate to expose a portion of the diffusion extension in the semiconductor material. A metal layer is formed in the semiconductor material at least in the exposed portion of the diffusion extension.

BRIEF DESCRIPTION OF THE DRAWINGS

The present invention will now be further described in the following pages of specification when taken in conjunction with the attached drawings, in which:

FIG. 1 is a graph of the current-voltage characteristics of an ideal diode and a Schottky diode;

FIG. 8 is a cross sectional view illustrating a transistor fabricated according to another embodiment of the invention.

DETAILED DESCRIPTION OF THE INVENTION

The I–V characteristics of a Schottky diode and an ideal diode are shown in FIG. 1. When a forward bias is placed on either a Schottky or an ideal diode, the current rises at a particular rate. For an ideal diode, for example, for every increase of about 60 mv the current increases by approximately a factor of 10. Also, as shown on the right side of FIG. 1, when an ideal diode is reverse biased, the current initially increases a small amount and then maintains a relatively constant value. In comparison, a Schottky diode has a higher starting current. This is illustrated by Point 1 in FIG. 1 which shows at about zero volts the Schottky diode has a higher current than an ideal diode. Additionally, the Schottky diode has a steeper slope under forward bias. For example, for every increase in voltage of approximately 40 mv the current increases by a factor of 10. Therefore, for a given voltage $V_1$, the Schottky diode will conduct a greater amount of current I, than an ideal diode $I_2$.

The present invention utilizes a Schottky diode in order to control the floating body effects of SOI. A Schottky diode is preferably formed only on the source side of an SOI transistor. The Schottky diode conducts current from the body to the source of the transistor, keeping a charge accumulating in the body low. The Schottky diode may be formed using a spacer which is at least partially disposable.

Figure 2:
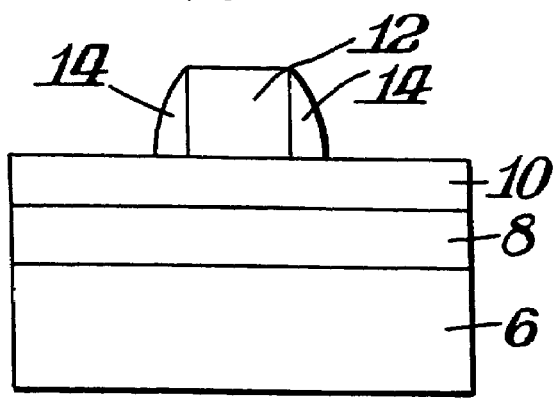
FIGS. 2–7 are cross sectional views illustrating the fabrication of a transistor according to one embodiment of the invention.

Referring now to FIGS. 2–7, a method of forming a Schottky contact for an SOI FET will be described. An SOI substrate comprises an insulating layer 8 formed on a base substrate 6. The insulating layer is typically silicon dioxide and the base substrate is usually silicon. A semiconductor material 10 in which the transistors are to be formed is arranged on the insulating layer 8. The semiconductor material 10 is also usually silicon. A gate conductor 12, which will define the gate of a MOS transistor, is formed on a top surface of the semiconductor material 10. First sidewall spacers 14 are formed on sides of the gate conductor 12 and on the top surface of the semiconductor material 10. The resulting structure is shown in FIG. 2. Alternatively, a gate insulating layer (not shown) may be formed between the semiconductor material 10 and the gate conductor 12.

Figure 3:
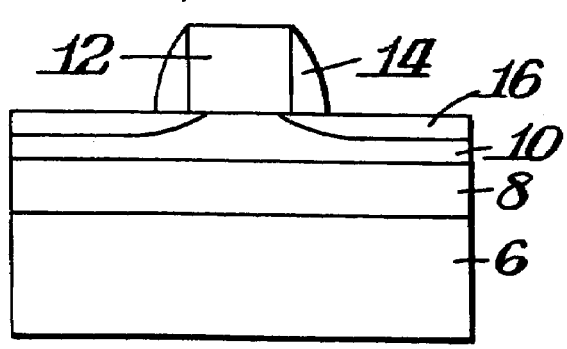

Next, as shown in FIG. 3, an extension region 16 is formed in the semiconductor material 10. The extension region 16 is usually formed by implanting an impurity at a doping concentration of about $10^{18}$ to $10^{19}$ dopants/cm$^3$. The implantation of the impurities may be conducted in a known manner to form the extension region 16. Ideally, the extension region 16 has a dopant concentration lower than that of the later formed diffusion regions and is formed over the surface of the semiconductor material 10 on both sides of the gate conductor 12. Also, the extension region 16 should extend under both the first spacers 14 and the gate conductor 12 as shown in FIG. 3. Preferably, the extension region 16 extends about 100–200 Å under the gate conductor 12. The depth the extension region 16 is formed into the semiconductor material 10 may vary depending upon the particular design of the transistor.

Figure 4:
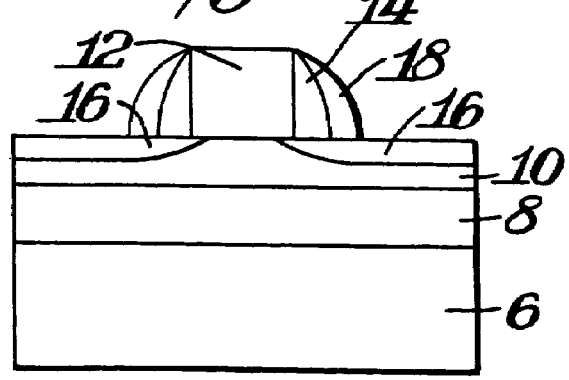

Referring now to FIG. 4, second spacers 18 are formed on the first spacers 14. The second spacers 18 should also be formed on the top surface of the semiconductor material 10 to cover a portion of the extension region 16. The first 14 and second 18 spacers are preferably formed so that a portion of the second spacers are disposable. This may be accomplished by forming the first and second spacers from different materials to facilitate the removal of the second spacers 18, if desired, at a later point in the process. For example, the first spacers 14 may be made of nitride and the second spacers 18 may be made of oxide. Additionally, the first and second spacers may be combined into a single structure, a portion of which is disposable.

Figure 5:
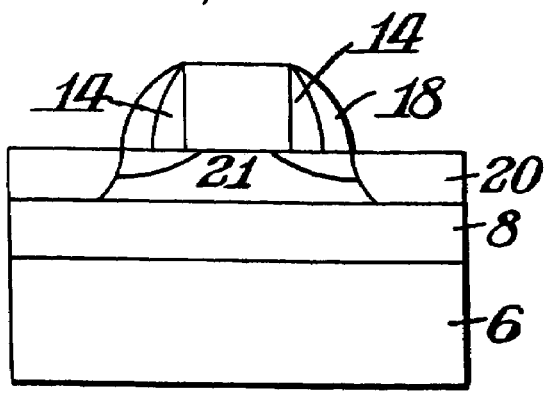

Next, diffusion regions 20, corresponding to the source and drain of a transistor, are formed in the semiconductor region 10 as shown in FIG. 5. The diffusion regions 20 may be formed by implanting an impurity at a doping concentration of approximately $10^{20}$–$10^{21}$ dopants/cm$^3$. The implantation of the impurities is preferably done in a known manner directly over the extension regions 16 using the second spacers 18 as a mask. The diffusion regions 20 should not extend very far under the second spacers 18, if at all. The portions of the extension region 16 formed under the second spacer 18 are protected from additional dopant implantation during the formation of the diffusion regions 20. Additionally, the diffusion regions 20 are formed deep into the semiconductor material 10 close to the insulating layer 8. Ideally, the diffusion regions 20 should reach the insulating layer 8, however in practice, the distance between the diffusion regions and the insulating layer 8 may be approximately 100 Å.

The process up to this point can be carried out using known techniques in the field of semiconductor manufacture. Various steps not directly related to the present invention have been omitted for clarity. However, it should be noted that the materials for the first and second spacers should be selected with the subsequent portion of the process in mind.

Figure 6:
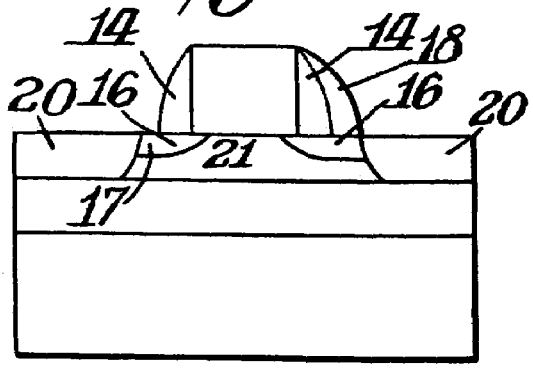

At this point, as shown in FIG. 6, a body 21 of the transistor has been defined in the semiconductor material 10 between the diffusion regions 20 and under the gate 12. Due to the presence of the insulating layer 8, the body 21 is isolated from the base substrate 6. Thus, the body 21 is typically electrically floating.

The extension regions 16 are also located between the diffusion regions 20 at the top surface of the semiconductor material 10. The first 14 and second 18 spacers are arranged on the semiconductor material 10, above the extension region 16. A portion of the extension region 16 at the top surface of the semiconductor material 10 can be exposed by removing a part of one of the spacers. The second spacer 18 was formed to be disposable as described above to facilitate the formation of the Schottky diode. The Schottky diode is formed by contacting the extension region with a metal layer. Preferably, the second spacer on source side is removed entirely or in part. The amount of the extension region 16 exposed can be varied by changing the size of the second spacer. A larger area of the extension region 16 covered by the second spacers 18 will result in more of the extension region 16 being exposed when the second spacer 18 is removed.

Figure 7:
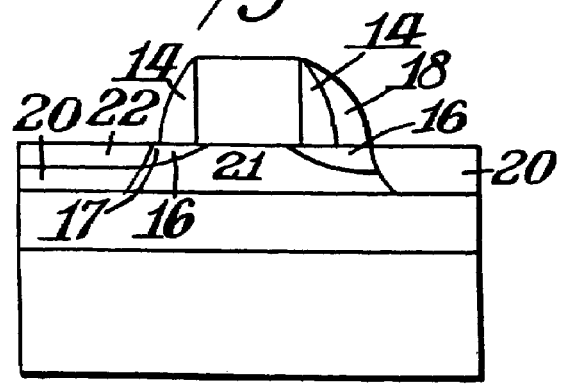

FIG. 6 shows the device with the second spacer 18 on one side of the gate conductor 12 removed. The second spacer may be removed by forming a mask exposing only the source side of the transistor. A removal procedure selective to material of the second spacer, such as a DHF dip, is performed to remove all or part of the second spacer, exposing a portion 17 of the extension region 16. The second spacer 18 on the drain side of the transistor preferably remains. The mask is then removed and a metal layer 22 is formed at least in the exposed portion 17 of the extension region 16 to form a Schottky diode. As shown in FIG. 7, the metal layer should be self-aligned to the first spacer 14. Any contact between the metal layer 22 and the extension region 16 should form a Schottky diode. The presence of the Schottky diode on the source side of the transistor will improve the leakage current between the body 21 and the source which, in turn, reduces the charge accumulated in the body 21 of the transistor. Ideally, the metal, preferably a silicide, is formed on the entire exposed surface of the substrate, that is, in both the exposed portion of the extension region 16 and in the diffusion region 20. By also forming the metal layer 22 in the diffusion region 20, the normal function of the metal layer of lowering the resistance of the source is achieved.

In the embodiment shown in FIG. 7, the metal layer 22 is formed deeper into the semiconductor material 10 than the extension region 16. The metal layer 22 thereby contacts the body 21 of the transistor. A metal layer 22 thus formed contacts the portion 17 of the extension region 16 exposed by removal of the second spacer 18, the body 21 of the transistor, and the diffusion region 20 that was abutting the exposed portion 17 of the extension region 16. As mentioned above, as long as the metal layer contacts a portion of the extension region 16, a Schottky diode should be formed. Thus, the metal layer may contact the body 21 of the transistor as shown in FIGS. 7, but this is not required. The Schottky diode may have more conduction if the metal layer contacts the body, but it will have a significant effect even if contact to the body is not established.

Thus, an asymmetric Schottky contact to an SOI transistor has been formed. The Schottky contact is formed by removing at least a portion of a disposable spacer from the source side of the transistor, while the spacer on the drain side remains. By removing the disposable spacer, a portion of a low doped extension region is exposed. A metal layer, such as a silicide, is then formed at least in the exposed extension region to form the Schottky contact. The metal layer may also be formed in the diffusion region adjacent to the exposed portion of the extension region, as well as in the diffusion region on the drain side of the transistor to lower the resistance of the source and/or drain. Any significant contact between the metal layer and the low doped extension region should result in the formation of a Schottky diode.

For extremely small gates where the lithography alignment to the gate is difficult, it is possible to remove the disposable spacers from both the source and drain sides of the transistor. The metal layer is then formed on both sides of the transistor resulting in symmetric Schottky contact to both the source and the drain of the transistor. FIG. 8 shows a transistor with symmetric Schottky contacts. The method of forming this device is substantially the same as the process for forming the asymmetric device described above except the step of forming the mask to expose only the source side of the transistor is omitted. Thus, in this case no extra lithography for exposing only the source is required. The second spacers are removed from both sides of the transistor. Therefore, when the metal layer 22 is formed, it is formed in the extension region 16 on both the source and drain side of the transistor, as shown in FIG. 8. Although forming symmetric Schottky contacts to both the source and the drain of a transistor requires fewer lithographic steps, there are some associated problems. The presence of the Schottky diode slightly increases the resistance of the transistor. Therefore, it is preferable that only one Schottky diode be formed to keep the resistance of the transistor at a minimum. Additionally, the quality of the Schottky contact to the drain should be controlled carefully in order to minimize the reverse bias leakage current from the drain. This can be achieved by numerous methods previously known, such as implanting the source and drain with germanium before forming the metal layer.

Accordingly a method and structure for minimizing the floating body effects of an SOI device has been provided. A Schottky contact to the source and/or drain is formed to reduce the charge accumulated in the body of the transistor. The Schottky contact is formed using disposable spacers such that the Schottky contact is self aligned. The Schottky diode enhances the forward bias leakage of the transistor and will hold the body of the transistor at a lower potential than it would otherwise sit. Thus, the range of body voltages of the transistor is narrowly bounded.

While a preferred embodiment of the invention has been described above, since variations in the invention will be apparent to those skilled in the art, the invention should not be construed as limited to the specific embodiments described above.

We claim:

1. A semiconductor device comprising:
    a semiconductor layer formed on an insulating layer;
    a gate conductor formed on the semiconductor layer;
    spacers formed on sidewalls of the gate conductor and on the semiconductor layer;
    extension regions arranged in the semiconductor layer on both sides of the gate conductor and extending under and contacting the spacers and a portion of the gate conductor, wherein a portion of at least one of the extension regions is exposed at a surface of the semiconductor layer by removing at least apart of one of the spacers;
    diffusion regions formed in the semiconductor layer adjacent to the extension regions; and
    a metal layer formed at least in the exposed portion of the extension region, the metal layer contacting die semiconductor layer and the exposed portion of the extension region.

2. The device according to claim 1, wherein the extension regions are lower doped than the diffusion regions.

3. The device according to claim 1, wherein the metal layer contacts at least one of the diffusion regions.

4. The device according to claim 1, wherein a portion of each extension region is exposed on both sides of the gate conductor at the surface of the semiconductor layer by removing at least a portion of each spacer and the metal layer is formed in the exposed portions of the extension regions.

5. The device according to claim 1, wherein the extension regions extend further under the spacers than the diffusion regions.

6. The device according to claim 1, wherein the metal layer and the exposed portion of the extension region form a Schottky diode.

7. The device according to claim 1, wherein the metal layer extends into the semiconductor layer.

8. The device according to claim 7, wherein the metal layer extends into a portion of the semiconductor layer below the extension regions.

9. An integrated circuit disposed on an SOI substrate having a body region, comprising:
    a transistor having
        a source diffusion region,
        a gate formed over the body region,
        a first sidewall spacer disposed on a sidewall of the gate abutting the source diffusion region,
        a drain diffusion region,
        a second sidewall spacer disposed on a sidewall of the gate abutting the drain diffusion region, wherein the first sidewall spacer is thinner than the second sidewall spacer, and
        extension regions provided under and contacting the first and second sidewall spacers, the extension regions contacting the gate and extending further under the gate than the source and drain diffusion regions, wherein a portion of at least one of the extension regions is exposed at a surface of the body region by removing at least a part of one of the first and second sidewall spacers; and
    a conductor formed at least in the exposed portion of the extension region, the conductor being in contact with the exposed portion of the extension region and at least a portion of the source diffusion region to form a Schottky diode.

10. The device according to claim 9 wherein the conductor contacts the body region.

* * * * *